United States Patent
Chen et al.

(10) Patent No.: US 10,403,567 B2
(45) Date of Patent: Sep. 3, 2019

(54) FABRICATION METHOD OF ELECTRONIC PACKAGE

(71) Applicant: Siliconware Precision Industries Co., Ltd., Taichung (TW)

(72) Inventors: Yan-Heng Chen, Taichung (TW); Chun-Tang Lin, Taichung (TW); Mu-Hsuan Chan, Taichung (TW); Chieh-Yuan Chi, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/866,144

(22) Filed: Jan. 9, 2018

(65) Prior Publication Data

US 2018/0130727 A1   May 10, 2018

Related U.S. Application Data

(62) Division of application No. 14/862,457, filed on Sep. 23, 2015, now Pat. No. 9,899,303.

(30) Foreign Application Priority Data

Oct. 15, 2014 (TW) .............................. 103135624 A (51) Int. Cl.
*H01L 21/48* (2006.01)
*H01L 23/498* (2006.01)
(Continued)

(52) U.S. Cl.
CPC .... *H01L 23/49811* (2013.01); *H01L 23/5389* (2013.01); *H01L 24/19* (2013.01);
(Continued)

(58) Field of Classification Search
CPC ......... H01L 21/48; H01L 21/56; H01L 21/00; H01L 21/486; H01L 21/568;
(Continued)

(56) References Cited

U.S. PATENT DOCUMENTS

2006/0138595 A1* 6/2006 Kiyotoshi ........... H01L 21/8221
257/532
2008/0296697 A1 12/2008 Hsu et al.
(Continued)

*Primary Examiner* — Chuong A Luu
(74) *Attorney, Agent, or Firm* — Mintz Levin Cohn Ferris Glovsky and Popeo, P.C.; Peter F. Corless; Steven M. Jensen (57) ABSTRACT

A method for fabricating an electronic package is provided, which includes the steps of: providing an insulating layer having at least an electronic element embedded therein; forming at least a first via hole on one side of the insulating layer; forming a first conductor in the first via hole of the insulating layer; forming on the insulating layer a first circuit structure electrically connected to the electronic element and the first conductor; and forming a second via hole on the other side of the insulating layer, wherein the second via hole communicates with the first via hole. As such, the second via hole and the first via hole constitute a through hole. Since the through hole is fabricated through two steps, the aspect ratio (depth/width) of the through hole can be adjusted according to the practical need so as to improve the process yield.

14 Claims, 5 Drawing Sheets

(51) Int. Cl.
*H01L 23/538* (2006.01)
*H01L 23/00* (2006.01)
*H01L 25/10* (2006.01)
*H01L 25/00* (2006.01)
*H01L 21/56* (2006.01)

(52) U.S. Cl.
CPC ............ *H01L 24/20* (2013.01); *H01L 25/105* (2013.01); *H01L 25/50* (2013.01); *H01L 21/486* (2013.01); *H01L 21/568* (2013.01); *H01L 24/96* (2013.01); *H01L 2224/04105* (2013.01); *H01L 2224/12105* (2013.01); *H01L 2225/1035* (2013.01); *H01L 2225/1041* (2013.01); *H01L 2225/1058* (2013.01); *H01L 2924/18162* (2013.01)

(58) Field of Classification Search
CPC ..... H01L 21/4853; H01L 24/19; H01L 24/20; H01L 24/96; H01L 25/50; H01L 25/105; H01L 2224/04105; H01L 2224/12105; H01L 2225/1035; H01L 2225/1041; H01L 2225/1058
USPC .................................. 257/738; 438/637, 672
See application file for complete search history.

(56) References Cited

U.S. PATENT DOCUMENTS

| | | |
|---|---|---|
| 2010/0044089 A1* | 2/2010 | Shibuya ............ H01L 23/49822 174/260 |
| 2010/0171185 A1* | 7/2010 | Moon ............... H01L 21/76831 257/384 |
| 2012/0319239 A1 | 12/2012 | Chang et al. |
| 2013/0285200 A1 | 10/2013 | Chang et al. |
| 2016/0111359 A1 | 4/2016 | Chen et al. |

\* cited by examiner

FABRICATION METHOD OF ELECTRONIC PACKAGE

CROSS-REFERENCE TO RELATED APPLICATION(S)

This application is a divisional of copending application U.S. Ser. No. 14/862,457, filed on Sep. 23, 2015, which claims under 35 U.S.C. § 119(a) the benefit of Taiwanese Application No. 103135624, filed Oct. 15, 2014, the entire contents of which are incorporated herein by reference.

BACKGROUND OF THE INVENTION

1. Field of the Invention

The present invention relates to packaging processes, and more particularly, to an electronic package and a fabrication method thereof so as to improve the process yield.

2. Description of Related Art

Through molding via (TMV) technology has been widely applied in semiconductor fields, which mainly involves forming via holes on a surface of an encapsulant by laser drilling so as to increase routing space. For example, a fan-out package on package (PoP) structure can be achieved by using TMV technology.

FIGS. 1A to 1F are schematic cross-sectional views showing a method for fabricating an electronic package 1 of a fan-out PoP structure according to the prior art.

Figure 1A:
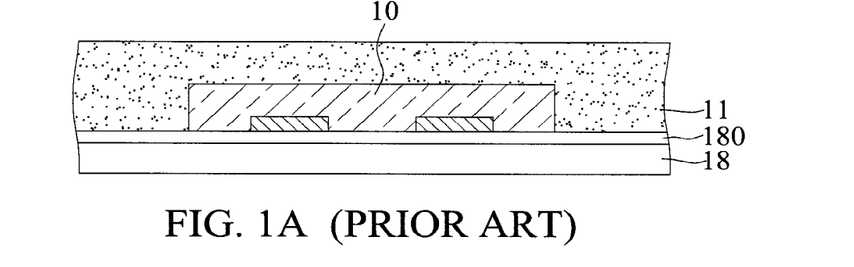
FIGS. 1A to 1F are schematic cross-sectional views showing a method for fabricating an electronic package according to the prior art, wherein FIG. 1E' shows another embodiment of FIG. 1E.

Referring to FIG. 1A, an electronic element 10 such as a chip is disposed on a release layer 180 of a first carrier 18, and then an insulating layer 11 is formed on the release layer 180 to cover the electronic element 10.

Figure 1B:
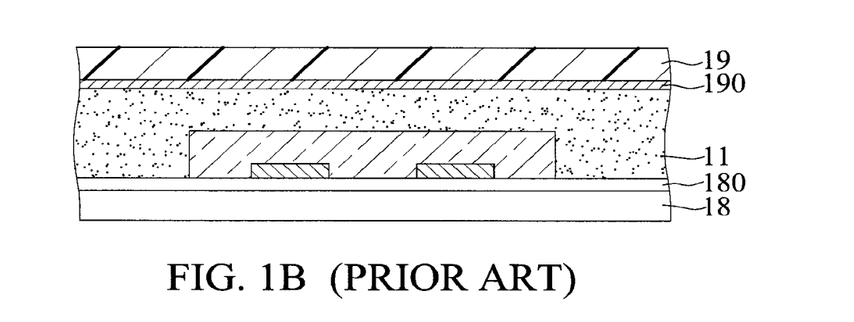

Referring to FIG. 1B, a second carrier 19 having a copper foil 190 is disposed on the insulating layer 11.

Figure 1C:
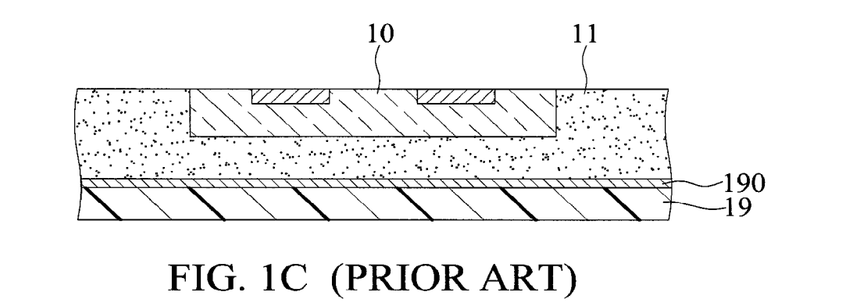

Referring to FIG. 1C, the first carrier 18 and the release layer 180 are removed to expose the electronic element 10 and the insulating layer 11.

Figure 1D:
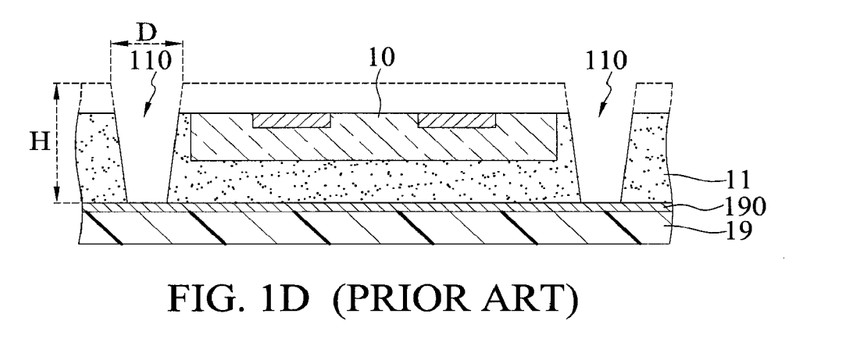

Referring to FIG. 1D, a plurality of through holes 110 are formed by laser drilling in the insulating layer 11 around a periphery of the electronic element 10.

Figure 1E:
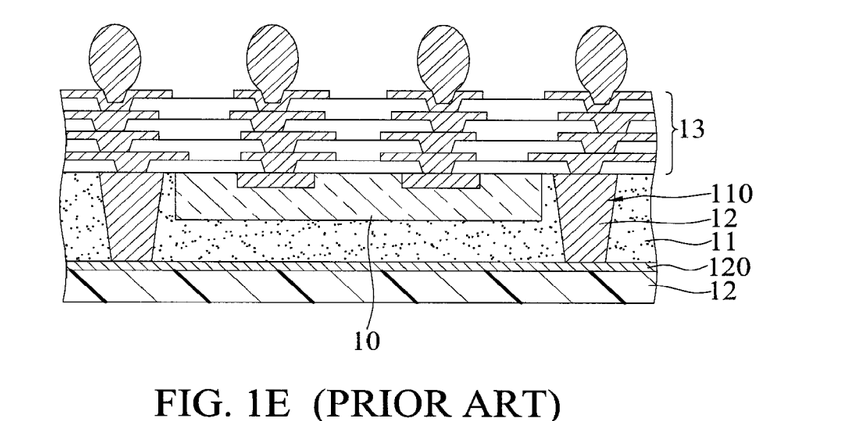

Referring to FIG. 1E, a copper electroplating process is performed to form a plurality of conductive posts 12 in the through holes 110. Then, a plurality of redistribution layers (RDLs) 13 are formed on the insulating layer 11 and electrically connected to the conductive posts 12 and the electronic element 10.

Figure 1F:
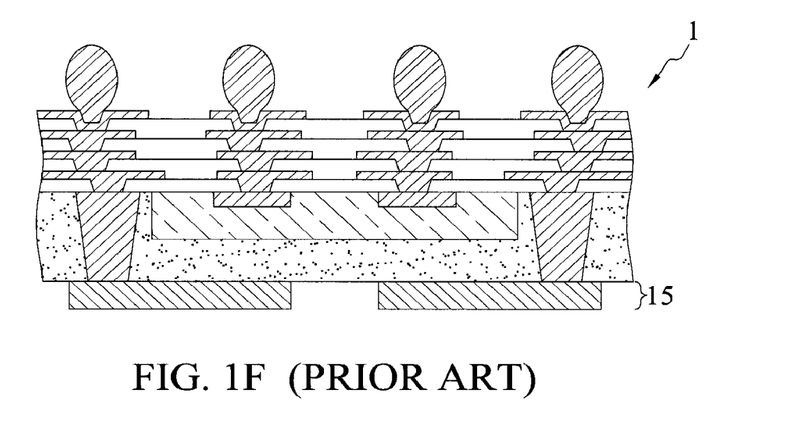

Referring to FIG. 1F, the second carrier 19 is removed and a patterning process is performed on the copper foil 190 to form a circuit structure 15. Then, a singulation process is performed.

As the electronic element 10 is developed toward miniaturization and high function, the thickness of the insulating layer 11 needs to be increased so as to increase the reliability of the electronic package 1.

However, to enable the above-described laser drilling process and the electroplating process for forming the conductive posts 12 to match one another, the aspect ratio (depth/width) of the through holes 110 must be less than 1.25. Therefore, an increase in thickness of the insulating layer 11 may greatly affect the above-described processes. In particular, if the thickness of the insulating layer 11 is increased (i.e., the depth H of the through holes 110 is increased), to keep the aspect ratio of the through holes 110 less than 1.25, the width D of the through holes 110 must be increased (as shown in dashed lines in FIG. 1D). As such, the electronic package 1 cannot meet the fine pitch requirement. On the other hand, if the aspect ratio in laser drilling is increased to 1.5, the bottom of the through hole 110' cannot be completely filled with copper through the electroplating process (i.e., an unplated area 12' is formed), as shown in FIG. 1E', thus adversely affecting the process yield and increasing the fabrication cost.

Further, during formation of the through holes 110 through the laser drilling process, residue (generated from such as the insulating layer 11) easily accumulates on the bottom of the through holes 110. The residue must be removed first before formation of the conductive posts 12 in the through holes 110. Otherwise, the residue may adversely affect the electrical transmission performance of the conductive posts 110. However, if the thickness of the insulating layer 11 is increased, i.e., the depth H of the through holes 110 is increased, it will become difficult to completely remove the residue in the through holes 110. As such, the electrical transmission performance of the conductive posts 110 may be adversely affected by the remaining residue.

Therefore, there is a need to provide an electronic package and a fabrication method thereof so as to overcome the above-described drawbacks.

SUMMARY OF THE INVENTION

In view of the above-described drawbacks, the present invention provides an electronic package, which comprises: an insulating layer having a first surface and a second surface opposite to the first surface, wherein at least a first via hole and a second via hole communicating with the first via hole are formed in the insulating layer, the first via hole communicating with the first surface of the insulating layer and the second via hole communicating with the second surface of the insulating layer; at least an electronic element embedded in the insulating layer; at least a first conductor correspondingly formed in the first via hole of the insulating layer; and a first circuit structure formed on the first surface of the insulating layer and electrically connected to the electronic element and the first conductor.

The present invention further provides a method for fabricating an electronic package, which comprises the steps of: providing an insulating layer having at least an electronic element embedded therein, wherein the insulating layer has opposite first and second surfaces; forming at least a first via hole in the insulating layer, wherein the first via hole communicates with the first surface of the insulating layer; forming a first conductor in the first via hole of the insulating layer; forming a first circuit structure on the first surface of the insulating layer, wherein the first circuit structure is electrically connected to the electronic element and the first conductor; and forming a second via hole in the insulating layer, wherein the second via hole communicates with the first via hole and the second surface of the insulating layer, the first via hole and the second via hole constituting a through hole.

In the above-described method, the insulating layer can be formed by molding or laminating.

In the above-described method, the first via hole or the second via hole can be formed by laser drilling, mechanical drilling or etching.

In the above-described electronic package and method, the electronic element can have an active surface with a plurality of electrode pads and an inactive surface opposite to the active surface. In an embodiment, the first surface of the insulating layer is flush with the active surface of the electronic element. In an embodiment, the second surface of the insulating layer is flush with the inactive surface of the electronic element.

In the above-described electronic package and method, the first conductor can be a metal post or a metal ball.

In the above-described electronic package and method, a second circuit structure can be formed on the second surface of the insulating layer and electrically connected to the first conductor. The second circuit structure can further be electrically connected to the electronic element.

In the above-described electronic package and method, a second conductor can be formed in the second via hole of the insulating layer and electrically connected to the first conductor. The second conductor can be a metal post.

In the above-described electronic package and method, an electronic package structure can further be stacked on the first surface or the second surface of the insulating layer.

According to the present invention, the through hole is fabricated through two steps so as not to be limited by the aspect ratio (depth/width) in laser drilling. That is, when the thickness of the insulating layer is increased, the aspect ratios of the first via hole and the second via hole can still be controlled to be less than 1.25 without the need to increase the widths of the first via hole and the second via hole. As such, the present invention meets the fine pitch requirement.

Further, since the aspect ratio of the first via hole does not increase, the first via hole can be effectively and completely plated with the first conductor.

Furthermore, since both the first via hole and the second via hole are less in depth than the through hole, the present invention can easily remove residue in the first via hole and the second via hole so as to improve the electrical transmission performance of the first conductor and the second conductor. Therefore, the present invention improves the process yield and reduces the fabrication cost.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2G are schematic cross-sectional views showing a method for fabricating an electronic package 2, 2', 3, 3' according to the present invention.

Figure 2A:
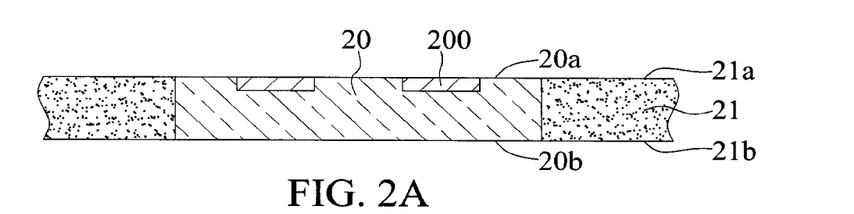
FIGS. 2A to 2G are schematic cross-sectional views showing a method for fabricating an electronic package according to the present invention, wherein FIGS. 2A', 2C', 2E', 2E" and 2G' show other embodiments of FIGS. 2A, 2C, 2E and 2G.

Referring to FIG. 2A, a carrier (not shown) having at least an electronic element 20 disposed thereon is provided and an insulating layer 21 is formed on the carrier to encapsulate the electronic element 20. Then, the carrier is removed.

The carrier 20 can be a metal board, a semiconductor wafer or a glass board. Further, a release film, an adhesive material or an insulating material can be formed on the carrier for bonding with the electronic element 20 and the insulating layer 21.

The electronic element 20 can be an active element such as a semiconductor chip, a passive element such as a resistor, a capacitor or an inductor, or a combination thereof. In the present embodiment, the electronic element 20 is a semiconductor chip having an active surface 20a with a plurality of electrode pads 200 and an inactive surface 20b opposite to the active surface 20a.

The insulating layer 21 has opposite first and second surfaces 21a, 21b. The first surface 21a of the insulating layer 21 is flush with the active surface 20a of the electronic element 20, and the second surface 20b of the insulating layer 21 is flush with the inactive surface 20b of the electronic element 20. In another embodiment, referring to FIG. 2A', the inactive surface 20b of the electronic element 20 is covered by the insulating layer 21.

The insulating layer 21 can be formed by such as molding or laminating.

Figure 2B:
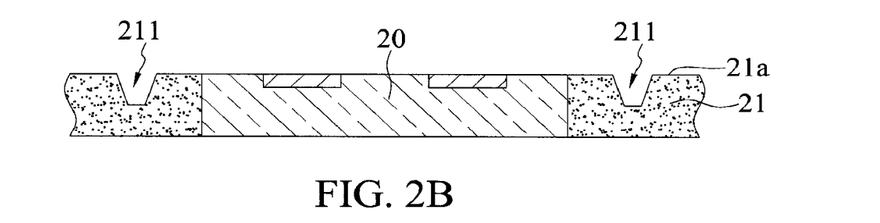

Referring to FIG. 2B, a plurality of first via holes 211 are formed in the insulating layer 21 around a periphery of the electronic element 20 and communicating with the first surface 21a of the insulating layer 21.

The first via holes 211 can be formed by such as laser drilling, mechanical drilling or etching.

Figure 2C:
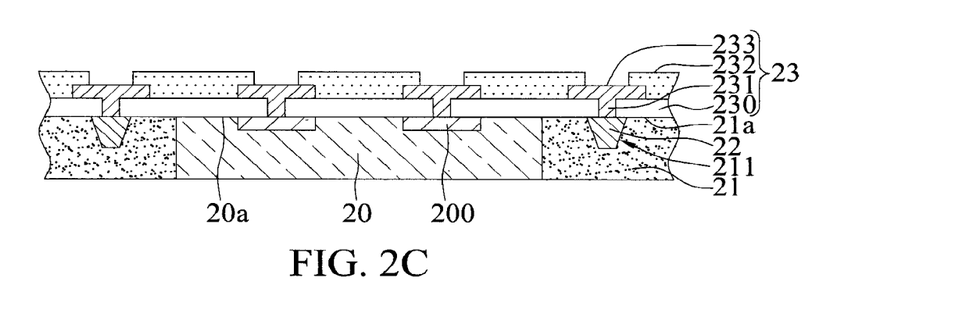

Referring to FIG. 2C, a plurality of first conductors 22 are formed in the first via holes 211, and then a first circuit structure 23 is formed on the first surface 21a of the insulating layer 21 and the active surface 20a of the electronic element 20.

The first conductors 22 can be formed by electroplating or deposition and made of copper, aluminum, titanium, conductive adhesive or a combination of at least two thereof. In the present embodiment, the first conductors 22 are metal posts, such as copper posts. In another embodiment, referring to FIG. 2C', the first conductors 22' are metal balls made of such as copper or solder.

The first circuit structure 23 has at least a dielectric layer 230, a redistribution layer 231 formed on the dielectric layer 230 and electrically connected to the electrode pads 200 of the electronic element 20 and the first conductors 22, 22', and an insulating layer 232 formed on the dielectric layer 230 and the redistribution layer 231.

Further, the redistribution layer 231 has a plurality of conductive pads 233 exposed from the insulating layer 232.

Figure 2D:
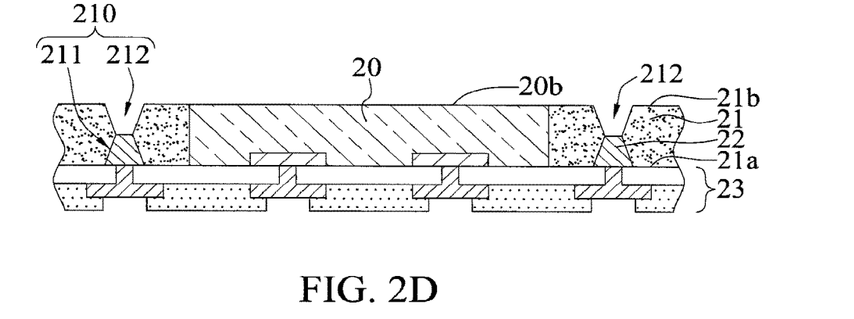

Referring to FIG. 2D, a plurality of second via holes 212 are formed in the insulating layer 21 and communicating with the second surface 21b of the insulating layer 21. Further, the second via holes 212 correspond in position to and communicate with the first via holes 211, respectively. As such, the first via holes 211 and the corresponding second via holes 212 constitute a plurality of through holes 210.

The second via holes 212 can be formed by laser drilling, mechanical drilling or etching.

Figure 2E:
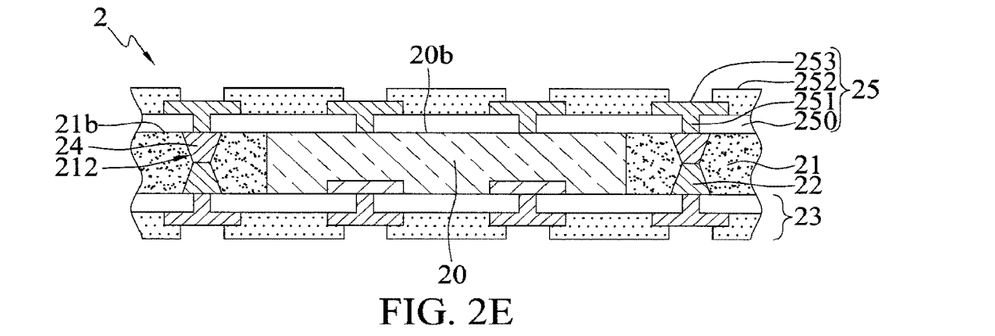

Referring to FIG. 2E, a plurality of second conductors 24 are formed in the second via holes 212, and then a second circuit structure 25 is formed on the second surface 21b of the insulating layer 21 and the inactive surface 20b of the electronic element 20. As such, an electronic package 2 is obtained.

In the present embodiment, the second conductors 24 are electrically connected to the first conductors 22. The second conductors 24 can be formed by electroplating or deposition and made of copper, aluminum, titanium, conductive adhesive or a combination of at least two thereof. In the present embodiment, the second conductors 24 are metal posts, such as copper posts.

The second circuit structure 25 has at least a dielectric layer 250, a redistribution layer 251 formed on the dielectric layer 250, and an insulating layer 252 formed on the dielectric layer 250 and exposing portions of the redistribution layer 251. The redistribution layer 251 is electrically connected to the second conductors 24 through a plurality of conductive vias and further electrically connected to the first conductors 22 through the second conductors 22. In addition, the redistribution layer 251 is connected to the inactive surface 20b of the electronic element 20 for heat dissipation. In another embodiment, referring to FIG. 2E", a redistribution layer 251' is directly formed in the second via holes 212 and electrically connected to the first conductors 22. As such, the dielectric layer 250 and the second conductors 24 are dispensed with.

Further, the redistribution layer 251, 251' has a plurality of conductive pads 253 exposed from the insulating layer 252.

In another embodiment, referring to FIG. 2E' which is continued from FIG. 2C, both the second conductors 24 and the second circuit structure 25 are dispensed with. That is, only the first conductors 22' are formed in the through holes 210. As such, an electronic package 2' is obtained.

Figure 2F:
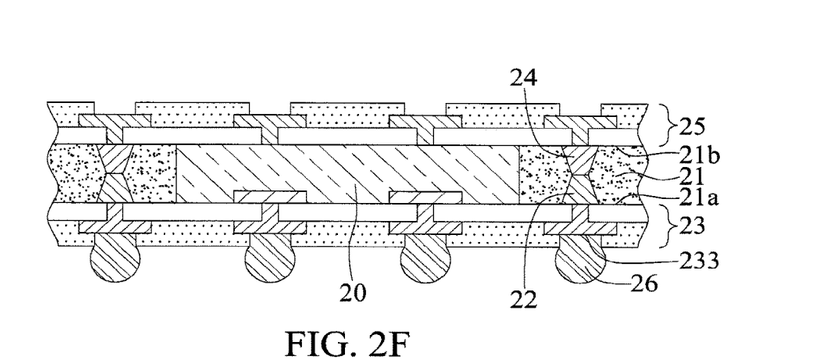

Subsequently, referring to FIG. 2F, continued from FIG. 2E, a plurality of conductive elements 26 such as solder balls or conductive bumps are formed on the conductive pads 233 of the first circuit structure 23.

Figure 2G:
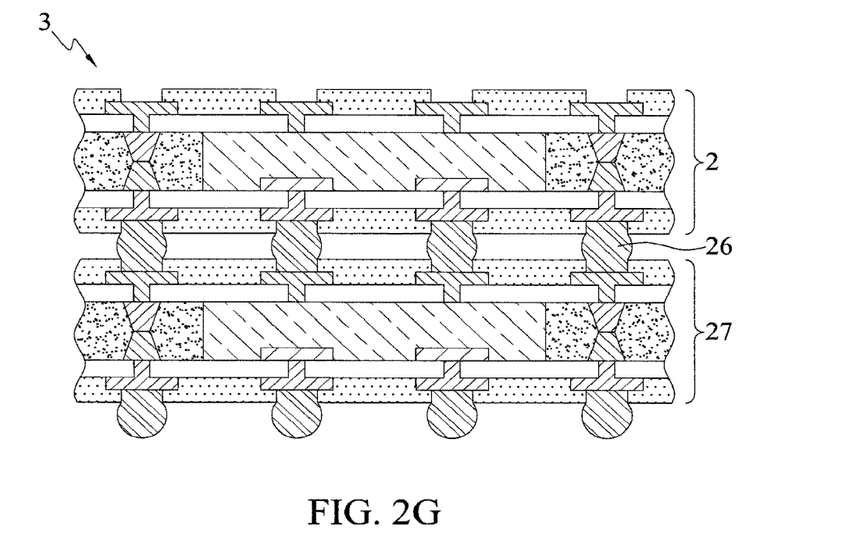

Thereafter, referring to FIG. 2G the electronic package 2 is stacked on and electrically connected to an electronic package structure 27 through the conductive elements 26, thus forming a PoP electronic package 3.

In the present embodiment, the electronic package structure 27 has the same configuration as the electronic package 2. As such, a plurality of electronic packages 2 can be stacked in the electronic package 3.

In another embodiment, referring to FIG. 2G', a plurality of electronic packages 2' as shown in FIG. 2E' are stacked on one another to form an electronic package 3'. In particular, portions of the conductive elements 26 of an upper electronic package 2' are received in the second via holes 212 of a lower electronic package 2' and electrically connected to the first conductors 22' of the lower electronic package 2'.

Further, portions of the conductive elements 26' of the upper electronic package 2' are selectively connected to the inactive surface 20b of the electronic element 20 of the lower electronic package 2' for heat dissipation.

According to the present invention, the through holes 210 are fabricated through two steps (i.e., fabricating the first via holes 211 and the second via holes 212) so as not to be limited by the aspect ratio in laser drilling. That is, when the thickness of the insulating layer 21 is increased, the aspect ratios of the first via holes 211 and the second via holes 212 can still be controlled to be less than 1.25 without the need to increase the widths of the first via holes 211 and the second via holes 212. As such, the present invention meets the fine pitch requirement.

Further, since the aspect ratio of the first via holes 211 does not increase, the first via holes 211 can be effectively and completely plated with the first conductors 22.

Furthermore, since both the first via holes 211 and the second via holes 212 are less in depth than the through holes 210, the present invention can easily remove the residue in the first via holes 211 and the second via holes 212 so as to improve the electrical transmission performance of the first conductors 22 and the second conductors 23. Therefore, the present invention improves the process yield and reduces the fabrication cost.

The present invention further provides an electronic package 2, 2', 3, 3', which has: an insulating layer 21 having a first surface 21a and a second surface 21b opposite to the first surface 21a, wherein at least a first via hole 211 and a second via hole 212 communicating with the first via hole 211 are formed in the insulating layer 21, the first via hole 211 communicating with the first surface 21a of the insulating layer 21 and the second via hole 212 communicating with the second surface 21b of the insulating layer 21; at least an electronic element 20 embedded in the insulating layer 21; at least a first conductor 22, 22' correspondingly formed in the first via hole 211 of the insulating layer 21; and a first circuit structure 23 formed on the first surface 21a of the insulating layer 21 and electrically connected to the electronic element 20 and the first conductor 22, 22'.

The first conductor 22, 22' can be a metal post or a metal ball.

In an embodiment, the electronic package 2, 3 further has a second circuit structure 25 formed on the second surface 21b of the insulating layer 21 and electrically connected to the first conductor 22. Further, the second circuit structure 25 can be electrically connected to the electronic element 20.

In an embodiment, the electronic package 2, 3 further has at least a second conductor 24 correspondingly formed in the second via hole 212 of the insulating layer 21. The second conductor 24 can be a metal post and electrically connected to the first conductor 22.

In an embodiment, the electronic package 3, 3' further has an electronic package structure 27 stacked on the first surface 21a or the second surface 21b of the insulating layer 21.

Therefore, by fabricating the through holes through two steps, the present invention allows the aspect ratio of the through holes to be adjusted according to the practical need so as to meet the fine pitch requirement and improve the product yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating an electronic package, comprising the steps of:

providing a single insulating layer having at least an electronic element embedded therein, wherein the insulating layer has opposite first and second surfaces;

forming at least a first via hole in the insulating layer, wherein the first via hole communicates with the first surface of the insulating layer and is free from communicating with the second surface of the insulating layer;

forming a first conductor in the first via hole of the insulating layer;

after forming the first conductor in the first via hole of the insulating layer, forming a first circuit structure on the first surface of the insulating layer, wherein the first circuit structure is in direct contact with and electrically connected to the electronic element and the first conductor; and after forming the first circuit structure on the first surface of the insulating layer, forming a second via hole in the insulating layer, wherein the second via hole communicates with the first via hole and the second surface of the insulating layer, the first via hole and the second via hole constituting a through hole.

2. The method of claim 1, wherein the insulating layer is formed by molding or laminating.

3. The method of claim 1, wherein the electronic element has an active surface with a plurality of electrode pads and an inactive surface opposite to the active surface.

4. The method of claim 3, wherein the first surface of the insulating layer is flush with the active surface of the electronic element.

5. The method of claim 3, wherein the second surface of the insulating layer is flush with the inactive surface of the electronic element.

6. The method of claim 1, wherein the first via hole is formed by laser drilling, mechanical drilling or etching.

7. The method of claim 1, wherein the first conductor is a metal post or a metal ball.

8. The method of claim 1, wherein the second via hole is formed by laser drilling, mechanical drilling or etching.

9. The method of claim 1, further comprising forming a second circuit structure on the second surface of the insulating layer, wherein the second circuit structure is electrically connected to the first conductor.

10. The method of claim 9, wherein the second circuit structure is electrically connected to the electronic element.

11. The method of claim 1, further comprising forming a second conductor in the second via hole of the insulating layer.

12. The method of claim 11, wherein the second conductor is electrically connected to the first conductor.

13. The method of claim 11, wherein the second conductor is a metal post.

14. The method of claim 1, further comprising stacking an electronic package structure on the first surface or the second surface of the insulating layer.

* * * * *